(12) United States Patent
Shin et al.

(10) Patent No.: US 11,206,046 B2
(45) Date of Patent: Dec. 21, 2021

(54) OPERATING METHOD OF MEMORY CONTROLLER, STORAGE DEVICE AND THE OPERATING METHOD THEREOF

(71) Applicant: SAMSUNG ELECTRONICS CO., LTD., Suwon-si (KR)

(72) Inventors: Dong-Min Shin, Seoul (KR); Min Uk Kim, Hwaseong-si (KR); Young Suk Ra, Seoul (KR); Tae Hyun Song, Suwon-si (KR); Seong Hyeog Choi, Hwaseong-si (KR); Hong Rak Son, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/823,913

(22) Filed: Mar. 19, 2020

(65) Prior Publication Data

US 2021/0050866 A1 Feb. 18, 2021

(30) Foreign Application Priority Data

Aug. 13, 2019 (KR) .................. 10-2019-0098568

(51) Int. Cl.
H03M 13/15 (2006.01)
H03M 13/11 (2006.01)
H03M 13/29 (2006.01)

(52) U.S. Cl.
CPC ... *H03M 13/1575* (2013.01); *H03M 13/1108* (2013.01); *H03M 13/153* (2013.01); *H03M 13/1545* (2013.01); *H03M 13/2942* (2013.01)

(58) Field of Classification Search
CPC ......... H03M 13/1575; H03M 13/1108; H03M 13/153; H03M 13/1545; H03M 13/2942;
(Continued)

(56) References Cited

U.S. PATENT DOCUMENTS 5,231,640 A 7/1993 Hanson et al.
8,996,793 B1 3/2015 Steiner et al.
(Continued)

FOREIGN PATENT DOCUMENTS

EP 2 416 248 A1 2/2012

OTHER PUBLICATIONS

Communication dated Jan. 13, 2021, issued by the European Patent Office in counterpart European Application No. 20170384.0.

*Primary Examiner* — Thien Nguyen
(74) *Attorney, Agent, or Firm* — Sughrue Mion, PLLC

(57) ABSTRACT

An operating method of a memory controller is provided. The operating method includes receiving a first read data and a second conversion information, the second conversion information including data obtained by converting a second read data based on a linear operation, and the first read data and the second read data including data read from same memory cells; converting the first read data based on the linear operation to generate a first conversion information; performing a logical operation on the first conversion information and the second conversion information to generate an operation information; performing an inverse operation of the linear operation on the operation information to generate a reliability information; and correcting an error of the first read data based on the first read data and the reliability information.

17 Claims, 9 Drawing Sheets

(58) Field of Classification Search
CPC ............. H03M 13/37; H03M 13/6306; H03M 13/2927; H03M 13/2906; H03M 13/3784; H03M 13/1102; H03M 13/152; G06F 11/1012

See application file for complete search history.

(56) References Cited

U.S. PATENT DOCUMENTS

| | | |
|---|---|---|
| 9,214,965 B2 | 12/2015 | Fitzpatrick et al. |
| 9,239,751 B1 | 1/2016 | Chen et al. |
| 9,406,377 B2 | 8/2016 | Conley et al. |
| 9,454,414 B2 | 9/2016 | Micheloni et al. |
| 9,690,512 B2 | 6/2017 | Shany et al. |
| 9,740,559 B2 | 8/2017 | Zhao |
| 2004/0078408 A1* | 4/2004 | Miller ................. G06F 7/726 708/492 |
| 2012/0036400 A1* | 2/2012 | Miller ................. G06F 11/10 714/54 |
| 2017/0046220 A1 | 2/2017 | Sharon et al. |
| 2019/0044541 A1 | 2/2019 | Kwok |
| 2019/0188075 A1* | 6/2019 | Kim ................. G06F 11/1048 |
| 2019/0190540 A1* | 6/2019 | Tsuboi ............. H03M 13/2906 |

\* cited by examiner

| new syndrome(CXOR2) | reliability information(WRB) |
|---|---|
| 000 | 0000000 |
| 001 | 0000001 |
| 010 | 0000010 |
| 100 | 0000100 |
| 011 | 0001000 |
| 110 | 0010000 |
| 101 | 0100000 |
| 111 | 1000000 |

OPERATING METHOD OF MEMORY CONTROLLER, STORAGE DEVICE AND THE OPERATING METHOD THEREOF

This application claims priority from Korean Patent Application No. 10-2019-0098568, filed on Aug. 13, 2019 in the Korean Intellectual Property Office, the disclosure of which is incorporated herein by reference in its entirety

BACKGROUND

1. Field

Methods and apparatuses consistent with embodiments relate to an operating method of a memory controller, a storage device, and an operating method thereof.

2. Related Art

A flash memory as a nonvolatile memory may maintain stored data even if a power is cut off. Recently, a storage device including a flash memory such as an embedded multi-media card (eMMC), a universal flash storage (UFS), a solid status drive (SSD), and a memory card are widely used. Such storage devices are convenient for storing or moving a large amount of data.

If programming and erasing are repeated in a nonvolatile memory device (such as a NAND flash memory device), threshold voltage dispersions move due to deterioration of characteristics of the memory cell or adjacent threshold voltage dispersions may overlap each other. Therefore, several error bits may be included in the read data.

In order to correct the error bits, the NAND flash memory device may use hard decision decoding and soft decision decoding. Although the hard decision decoding is efficient due to the usage of fewer resources, error correction capability may be lower than soft decision decoding. On the other hand, although the soft decision decoding has higher error correction capability than the hard decision decoding, it uses many resources.

The NAND flash memory device may use the soft decision decoding if the hard decision decoding fails. However, such a manner has a drawback in that the decoding latency increases.

SUMMARY

One or more embodiments provide an operating method of a memory controller having a high error correction capability, while using fewer resources.

One or more embodiments provide a storage device having a high error correction capability, while using fewer resources.

One or more embodiments provide an operating method of a storage device having a high error correction capability, while using fewer resources.

However, embodiments are not restricted to those set forth herein. The above and other embodiments will become more apparent to one of ordinary skill by referencing the detailed description given below.

According to an aspect of an embodiment, an operating method of a memory controller includes receiving a first read data and a second conversion information, the second conversion information including data obtained by converting a second read data based on a linear operation, and the first read data and the second read data including data read from same memory cells; converting the first read data based on the linear operation to generate a first conversion information; performing a logical operation on the first conversion information and the second conversion information to generate an operation information; performing an inverse operation of the linear operation on the operation information to generate a reliability information; and correcting an error of the first read data based on the first read data and the reliability information.

According to another aspect of an embodiment, an operating method of a memory controller includes receiving a first read data and a second syndrome, the second syndrome including data obtained by converting a second read data, and the first read data and the second read data including hard decision read data which are read from same memory cells; converting the first read data to generate a first syndrome; executing an XOR or an XNOR operation on the first syndrome and the second syndrome to generate a new syndrome; executing a Berlekamp Massey algorithm and a Chien Search on the new syndrome to generate a reliability information; and correcting an error of the first read data based on the first read data and the reliability information.

According to another aspect of an embodiment, a storage device includes a memory device configured to read a first read data and a second read data from same memory cells, convert the second read data based on a linear operation to generate a second conversion information, and output the first read data and the second conversion information; and a memory controller configured to receive the first read data and the second conversion information, convert the first read data based on the linear operation to generate a first conversion information, execute a logical operation on the first conversion information and the second conversion information to generate an operation information, perform an inverse operation of the linear operation on the operation information to generate a reliability information, and correct an error of the first read data based on the first read data and the reliability information.

According to an aspect of an embodiment, an operating method of a storage device including a memory device and a memory controller includes reading, by the memory device, a plurality of memory cells to generate a first read data; reading, by the memory device, the plurality of memory cells to generate a second read data; dividing, by the memory device, the second read data into a plurality of second sub-read data; converting, by the memory device, each of the plurality of second sub-read data, based on a linear operation to generate a plurality of second sub-conversion information; and outputting, by the memory device, the first read data and the plurality of second sub-conversion information.

Other features and embodiments may be apparent from the following detailed description, the drawings, and the claims.

BRIEF DESCRIPTION OF THE DRAWINGS

The above and other aspects and features will become more apparent from the following detailed description with reference to the attached drawings, in which.

DETAILED DESCRIPTION

Hereinafter, various embodiments will be described with reference to the accompanying drawings. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
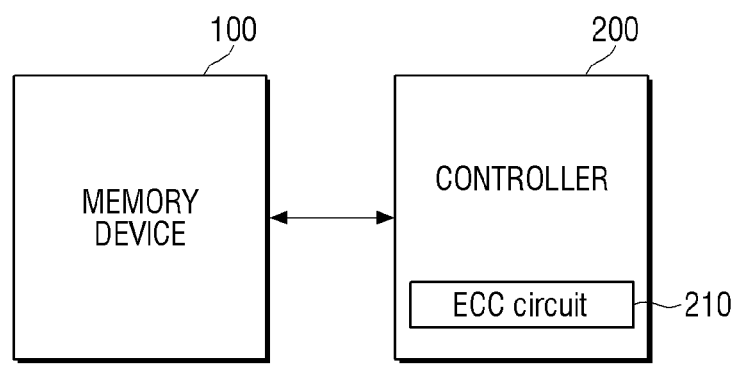
FIG. 1 is a block diagram for explaining a storage device according to some embodiments.

FIG. 1 is a block diagram for explaining a storage device according to some embodiments.

The storage device according to some embodiments includes a memory device 100 and a memory controller 200.

The storage device may be implemented as, but is not limited to, a smart card, a secure digital (SD) card, a multimedia card (MMC), an embedded MMC (eMMC), an embedded multi-chip package (eMCP), a perfect page NAND (PPN), a universal flash storage (UFS), a USB flash drive, a solid status drive (SSD) or an embedded SSD (eSSD).

The memory device 100 may be, for example, but is not limited to, a device based on a nonvolatile memory (e.g., a flash memory).

The memory controller 200 generally controls the action of the memory device 100. The memory controller 200 interprets a command provided from a host, and may control the action of the memory device 100, for example, a program, a read, an erase operation, and the like, depending on the interpreted result.

The memory controller 200 includes an error-correcting code (ECC) circuit 210 inside. The ECC circuit 210 performs an encoding operation on the data provided from the host to generate a parity bit. Data (including the parity bits) are provided to the memory device 100 and programmed into the memory device 100.

The ECC circuit 210 also receives data (including the parity bits) and additional information read from the memory device 100, executes a decoding operation, and executes an error correction operation. Here, the additional information (refer to CHDR2 of FIG. 5, SYD2 of FIG. 7, etc.) will be specifically described later with reference to FIGS. 5 to 12.

Figure 2:
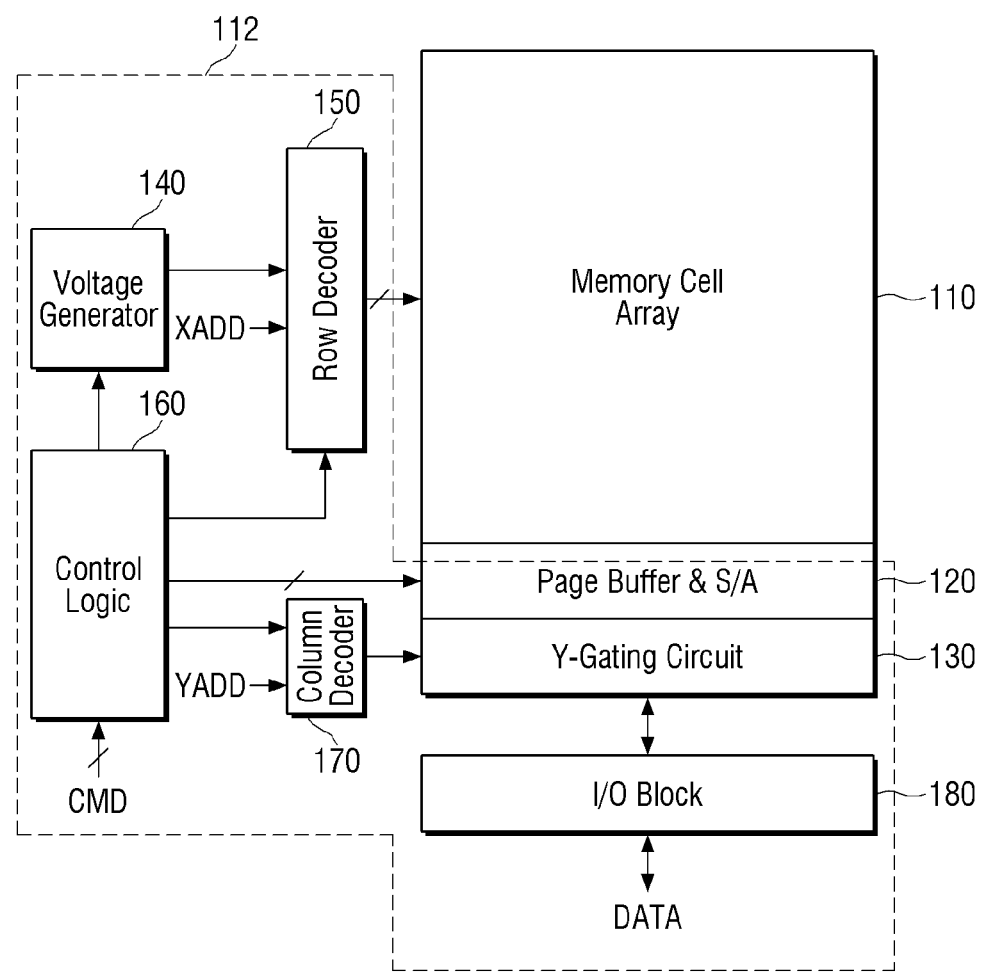
FIG. 2 is an exemplary block diagram for explaining a memory device of FIG. 1.
Figure 3:
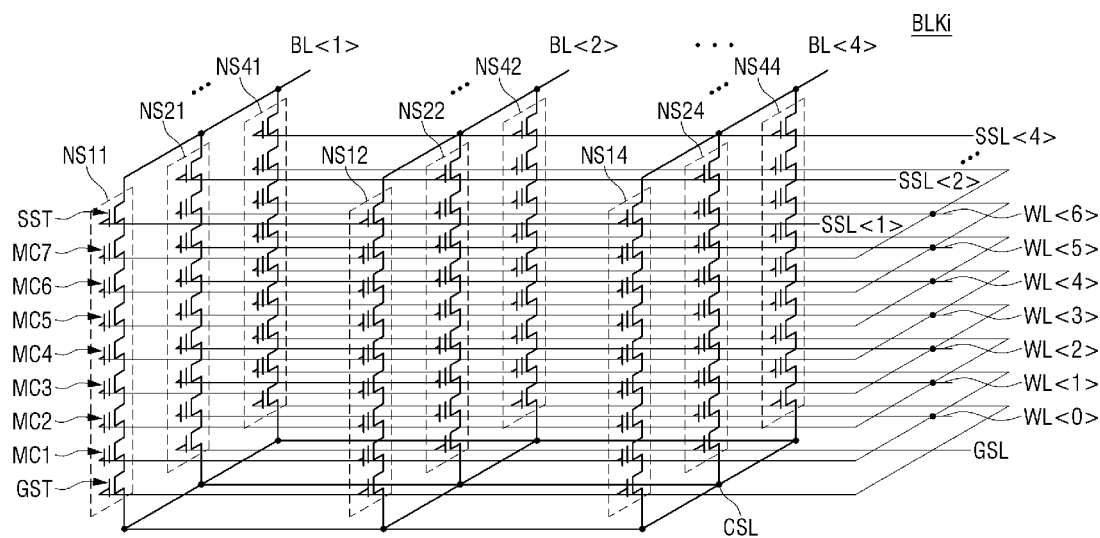
FIG. 3 is an exemplary circuit diagram for explaining a memory cell array of FIG. 2.

FIG. 2 is an exemplary block diagram for explaining the memory device of FIG. 1. FIG. 3 is an exemplary circuit diagram for explaining the memory cell array of FIG. 2. FIGS. 2 and 3 will be described on the basis of a NAND flash memory device, but embodiments are not limited thereto.

Referring to FIG. 2, the memory device 100 includes a memory cell array 110 and an access circuit 112.

The memory cell array 110 may be a two-dimensional memory cell array or a three-dimensional memory cell array. Here, the three-dimensional memory cell array will be exemplarily described with reference to FIG. 3.

In the three-dimensional memory cell array, the array of the memory cells may be monolithically formed within one or more physical levels, and may include a circuit related to the action of the memory cells. The term monolithic means that layers of each level of the array are directly deposited on layers of each underlying level of the array. The three-dimensional memory cell array may include a vertical NAND string that is vertically oriented such that at least one memory cell is located over other memory cells. At least one memory cell may include a charge trap layer.

Referring to FIG. 3, cell strings NS11 to NS41 are provided between a first bit line BL<1> and a common source line CSL. Cell strings NS12 to NS42 are provided between a second bit line BL<2> and the common source line CSL. Cell strings NS14 to NS44 are provided between a fourth bit line BL<4> and the common source line CSL.

A string selection transistor SST of each cell string NS is connected to a corresponding bit line BL. A ground selection transistor GST of each cell string NS is connected to the common source line CSL. Memory cells MC1 to MC7 are provided between the string selection transistor SST and the ground selection transistor GST of each cell string NS.

Rows and columns of the cell string NS are defined as follows.

The cell strings NS commonly connected to a single bit line form a single column. For example, the cell strings NS11 to NS41 connected to the first bit line BL<1> correspond to a first column. Cell strings NS12 to NS42 connected to the second bit line BL<2> correspond to a second column. Cell strings NS14 to NS44 connected to the fourth bit line BL<4> correspond to a fourth column.

The cell string NS connected to the single string selection line SSL forms a single row. For example, the cell strings NS11 to NS14 connected to the first string selection line SSL<1> form a first row. The cell strings NS21 to NS24 connected to the second string selection line SSL<2> form a second row. The cell strings NS41 to NS44 connected to the fourth string selection line SSL<4> form a fourth row.

Each cell string NS includes a ground selection transistor GST. The ground selection transistor GST may be controlled by a single ground selection line GSL. Alternatively, the cell strings corresponding to each row may be controlled by ground selection lines different from each other. For example, the ground selection transistors of each of the cell strings NS11, NS12 and NS14 corresponding to the first row may be connected to a first ground selection line GSL1. Further, the ground selection transistors of each of the cell strings NS21, NS22 and NS24 corresponding to the second row may be connected to a second ground selection line GSL2. The ground selection transistors of each of the cell strings NS41, NS42 and NS44 corresponding to the fourth row may be connected to a fourth ground selection line GSL4.

Memory cells corresponding to the same semiconductor layer share word lines WL<0> to WL<6>.

The cell strings NS of the same row share the string selection line SSL. The cell strings NS of the different rows are connected to the string selection lines SSL<1>, SSL<2> and SSL<4> different from each other, respectively. Hereinafter, the first string selection transistors SST1 are defined as string selection transistors SST connected to the first string selection line SSL<1>. The second string selection transistors SST2 are defined as string selection transistors SST connected to the second string selection line SSL<2>. The fourth string selection transistors SST4 are defined as string selection transistors SST connected to the fourth string selection line SSL<4>.

The common source line CSL is commonly connected to the cell strings NS.

The first memory cell array 110 may include a plurality of memory cell blocks BLKi. A single memory block BLKi may be divided into a plurality of string units that shares a single string selection line SSL. That is, the memory block BLKi may be divided into sub-blocks SB including a plurality of cell strings that shares a single string.

The three-dimensional memory cell array may be implemented through a wafer stack, a chip stack or a cell stack.

Referring to FIG. 2 again, an access circuit 112 may include a voltage generator 140, a row decoder 150, a control logic 160, a column decoder 170, a page buffer and sensing amplifier block 120, a Y gating circuit 130, an I/O block 180, and the like.

The control logic 160 controls the overall operation of the access circuit 112 in accordance with the command CMD provided from the memory controller 200. For example, the control logic 160 may sense memory read status information during a memory read operation and may control to provide the read data to the memory controller 200.

The voltage generator 140 may generate a voltage required for an access operation in accordance with the control code generated by the control logic 160. The voltage generator 140 generates a program voltage and a program verification voltage necessary for executing the program operation, generates a read voltage necessary for executing the read operation, and generates an erase voltage and an erase verification voltage necessary for executing the erase operation. In addition, the voltage generator 140 provides a voltage necessary for executing each operation to the row decoder 150.

The column decoder 170 decodes a column address YADD under the control of the control logic 160 and provides a plurality of selection signals to the Y gating circuit 130.

The page buffer and sensing amplifier block 120 includes a plurality of page buffers. Each of the plurality of page buffers is connected to each of a plurality of bit lines.

Each of the plurality of page buffers may operate as a driver for temporarily storing data which is read from the memory cell array 110 during the data read operation, in accordance with the control of the control logic 160. Also, each of the plurality of page buffers may operate as a detection amplifier capable of detecting and amplifying the respective voltage levels of the plurality of bit lines during the read operation, in accordance with the control of the control logic 160.

The Y gating circuit 130 may be control transmission of data DATA between the page buffer and sensing amplifier block 120 and the I/O block 180 in response to a plurality of selection signals provided from the column decoder 170.

The I/O block 180 may transmit data DATA, which is input from the outside, to the Y gating circuit 130 or may transmit data DATA, which is output from the Y gating circuit 130, to the memory controller 200 through a plurality of I/O fins (or data bus).

Figure 4:
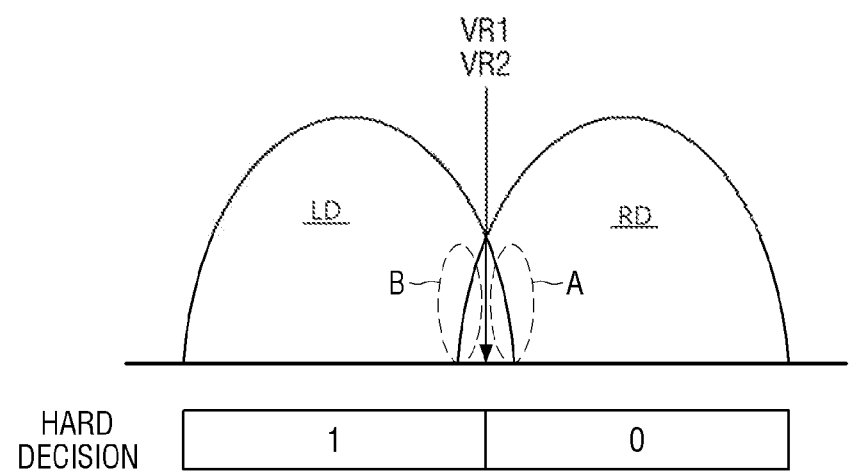
FIG. 4 is a diagram for explaining a threshold voltage distribution of a deteriorated memory cell and a hard decision read operation.

FIG. 4 is a diagram for explaining the threshold voltage distribution of a deteriorated memory cell and the hard decision read operation.

First, the hard decision read operation refers to a normal data read operation. Specifically, when the read voltage is supplied to a word line of the memory cell, the data stored in the memory cell is read as 1 or 0 depending on the on/off status of the corresponding memory cell. The soft decision read operation refers to formation of information in which a plurality of read voltages (that is, a soft decision read voltages) having a certain voltage difference on the basis of read voltage for the hard decision (that is, a hard decision read voltage) is applied to the memory cell to add reliability to the hard decision read data. The hard decision read operation is also called hard decision decoding, and the soft decision read operation is also called soft decision decoding.

Referring to FIG. 4, two threshold voltage dispersions LD and RD are illustrated. Although only two threshold voltage dispersions LD and RD are illustrated, on the basis of a case in which one bit is stored in one memory cell, this is an example and embodiments are not limited thereto. For example, when q (here, q is a natural number of 2 or more) bits are stored in one memory cell, $2^q$ threshold voltage dispersions may be formed. In other words, in the case of a Multi Level Cell (MLC), a Triple Level Cell (TLC), and a Quadruple Level Cell (QLC) in which two or more bits are stored, four, eight, and sixteen threshold voltage dispersions may be formed, respectively.

When programmed normally, the two adjacent threshold voltage dispersions LD and RD are sufficiently separated from each other so that they may be clearly distinguished by the hard decision read voltage (e.g., VR1).

However, a charge loss may occur in which electrons trapped on the tunnel oxide (or floating gate) are emitted over time. In addition, as program and erase operations are repeatedly performed, the tunnel oxide is deteriorated and the charge loss may further increase. The charge loss may reduce the threshold voltage, and for example, threshold voltage dispersion may move to one side. Also, a program disturbance, an erase disturbance, a back pattern dependency, and the like may increase the threshold voltage dispersion. For the aforementioned reasons, the characteristics of the nonvolatile memory cell may be deteriorated. As a result, as illustrated in FIG. 4, adjacent threshold voltage dispersions, LD and RD, may overlap each other.

If the threshold voltage dispersions LD and RD overlap each other in this way, an error may be included in the read data when reading is performed using a specific hard decision read voltage (e.g., VR1).

The memory cell corresponding to the threshold voltage dispersion LD should be read as 1, and the memory cells corresponding to threshold voltage dispersion RD should be read as 0. However, if reading is performed using a specific hard decision read voltage (e.g., VR1), the memory cell corresponding to a region A may be read as 0 rather than 1, and the memory cell corresponding to a region B may be read as 1 rather than 0. That is, errors may occur.

Hereinafter, a method for correcting the errors will be specifically described using FIGS. 5 to 12.

Figure 5:
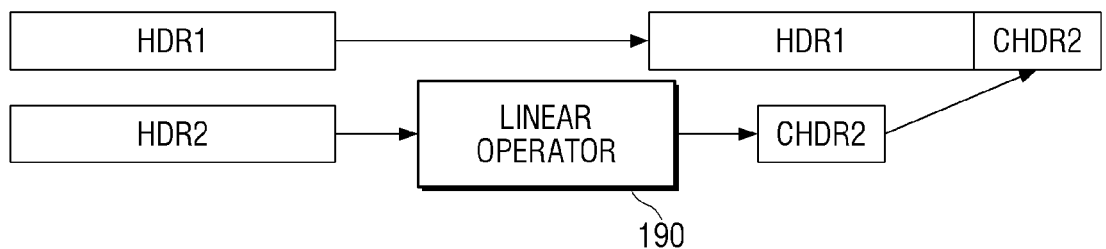
FIG. 5 is a block diagram for explaining the action of the memory device in the storage device according to an embodiment.

FIG. 5 is a block diagram for explaining the action of the memory device in the storage device according to an embodiment.

Referring to FIG. 5, the memory device 100 may include a linear operator 190. the memory device 100 reads the same memory cell twice to generate read data HDR1 and HDR2. The memory device 100 reads the plurality of memory cells using the first read voltage (see VR1 of FIG. 4) to generate first read data HDR1. Further, the memory device 100 reads the plurality of memory cells using the second read voltage (see VR2 of FIG. 4) to generate second read data HDR2. Here, the first read voltage VR1 and the second read voltage VR2 may or may not be the same. The first read data HDR1 and the second read data HDR2 may be hard decision read data obtained by the hard decision read operation. Although FIG. 5 shows an example of only two reads, embodiments are not limited thereto.

That is, the first read data HDR1 and the second read data HDR2 may be data that are read at the same read voltage (the threshold voltage). Alternatively, the first read data HDR1 and the second read data HDR2 may be data that are read at preset different threshold voltages. Alternatively, the first read data HDR1 and the second read data HDR2 may be data which are set adaptively depending on the status of the NAND flash memory device (for example, the program-erase cycle, the time, the temperature, etc.) and read at different threshold voltages.

Subsequently, the second read data HDR2 is converted into second conversion information CHDR2 through the first linear operator 190.

The first linear operator 190 performs a compression action that may reduce the size of the second read data HDR2. For example, the first linear operator 190 may perform the compression action based on the linear operation. The first linear operator 190 may be configured, for example, only by XOR or only by XNOR.

Here, if the first linear operator 190 is expressed by a function F, CHDR2=F(HDR2) is established.

The size of the first read data HDR1 is N bits (here, N is a natural number of 2 or more), and the size of the second read data HDR2 is also N bits. Each read data of N bits (HDR1, HDR2) includes data of n bits (here, n is a natural number) and parity bits of w bits (here, w is a natural number smaller than n) corresponding to the aforementioned data. The size of the second conversion information CHDR2 converted by the first linear operator 190 is M bits (here, M is a natural number smaller than N). For example, the size of the second conversion information CHDR2 may be 10% or less of the size of the second read data HDR2. More specifically, if the second read data HDR2 is 256 bits, the second conversion information CHDR2 may be 25 bits.

The memory device 100 outputs the first read data HDR1 and the second conversion information CHDR2 to the memory controller 200.

The action of the memory device 100 in FIG. 5 is summarized to generate/output HDR1+CHDR2 (=HDR1+F(HDR2)).

Figure 6:
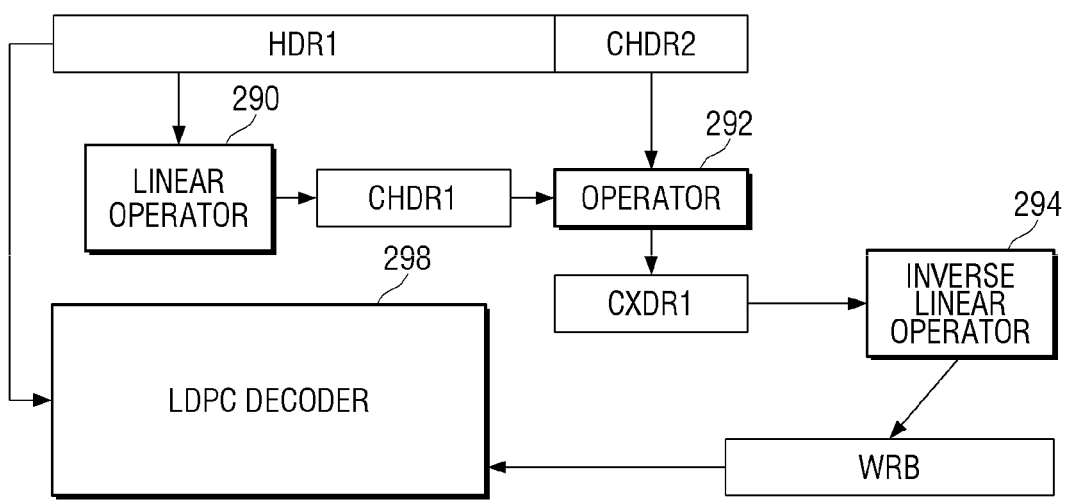
FIG. 6 is a block diagram for explaining the action of the memory controller in the storage device according to an embodiment.

FIG. 6 is a block diagram for explaining the action of the memory controller in the storage device according to an embodiment. For example, the memory controller 200 may include a second linear operator 290, operator 292, inverse linear operator 294 and decoder 298 (e.g., a low-density parity-check (LDPC) decoder).

Referring to FIG. 6, the memory controller 200 receives provision of first read data HDR1 and second conversion information CHDR2 from the memory device 100.

Subsequently, the first read data HDR1 is converted into first conversion information CHDR1, using the second linear operator 290. Here, a first linear operator (see 190 of FIG. 5) for generating the second conversion information CHDR2, and a second linear operator 290 for generating the first conversion information CHDR1 are of the same type. The second linear operator 290 executes the compression action that may reduce the size of the first read data HDR1, but executes the compression action based on the linear operation. The second linear operator 290 may be configured, for example, only by XOR or only by XNOR. If the second linear operator 290 is expressed by the function F, CHDR1=F(HDR1) is established.

Therefore, the size of the first read data HDR1 is N bits (here, N is a natural number of 2 or more), and the size of the first conversion information CHDR1 converted by the second linear operator 290 is M bits (here, M is a natural number smaller than N). For example, the size of the first conversion information CHDR1 may be 10% or less of the size of the first read data HDR1. If the first read data HDR1 is 256 bits, the first conversion information CHDR1 may be 25 bits.

The operator 292 performs a logical operation on the first conversion information CHDR1 and the second conversion information CHDR2 to generate operation information CXDR1. The logical operation may include an XOR operation or an XNOR operation. For example, the action of the operator 292 may be summarized as CXDR1=CHDR1+CHDR2=F(HDR1)+F(HDR2) (here, + means mod 2 addition, that is, a logical operation XOR). As described above, the first linear operator 190 and the second linear operator 290 are of the same type and execute the linear operation. Therefore, F(HDR1)+F(HDR2)=F(HDR1+HDR2) is established. This is because F(A)+F(B)=F(A+B) is established for the linear operation function F.

Subsequently, the operation information CXDR1 is converted into reliability information WRB, using an inverse linear operator 294. The reliability information WRB is information indicating a position of an error in the first read data HDR1. The inverse linear operator 294 executes the inverse operation of the linear operators 190 and 290 described above. That is, the action of the inverse linear operator 294 may be summarized as WRB=$F^{-1}$(CXDR1)=$F^{-1}$(CHDR1+CHDR2)=$F^{-1}$(F(HDR1+HDR2))=HDR1+HDR2. As a result, the reliability information WRB becomes HDR1+HDR2. The reliability information WRB is N bits having the same size as those of the first read data HDR1 and the second read data HDR2.

Decoder 298 executes an action of correcting an error of the first read data HDR1 on the basis of the first read data HDR1 and reliability information WRB.

For example, the first read data HDR1 is 1111111 and the second read data HDR2 is 1111110. Because the first read data HDR1 and the second read data HDR2 are not the same despite being read from the same memory cell, it may be known that there is an error in the first read data HDR1 or the second read data HDR2. Because the operated reliability information WRB is the XOR operation of the first read data HDR1 and the second read data HDR2, the operated reliability information WRB is 000001. Because the last bit is 1 in the reliability information WRB, the decoder 298 may know that the last bit of the first read data HDR1 is different from the last bit of the second read data.

The memory controller 200 may check whether the error correction of the first read data HDR1 is possible on the basis of the operation information CXDR1. When the operation information CXDR1 is a preset specific value, the memory controller 200 may determine that error correction is not possible.

If the memory controller 200 determines that the error correction is not possible, the generated reliable information WRB is ignored and the first read data HDR1 may be processed in accordance with the preset manner. The preset manner is a manner that, for example, does not correct the first read data HDR1, on the assumption that there is no error in the first read data HDR1 (that is, no error case). Alternatively, the preset manner is a manner that corrects the first read data HDR1 on the assumption that an error has occurred in all the bits of the first read data HDR1 (that is, all error case). Alternatively, if the memory controller 200 determines that the error correction is not possible more than a preset reference number of times, the number of bits of the first conversion information CHDR1 and the second conversion information CHDR2 may be increased. This is because if the number of bits of the first conversion information CHDR1 and the second conversion information CHDR2 is increased, the number of error bits that may be changed increases.

Referring to FIGS. 5 and 6, the memory device 100 outputs the first read data HDR1 and the second conversion information CHDR2 (that is, the compressed data of the second read data HDR2). If the memory device 100 outputs the second read data HDR2 without compression, it is necessary to output both the first read data HDR1 and the second read data HDR2. Therefore, it takes twice as much time compared to a case of outputting only the first read data HDR1. However, in the storage device according to some embodiments, the second conversion information CHDR2 is compressed to about $\frac{1}{10}$ as compared to the second read data HDR2. Therefore, it takes about 1.1 times to output the first read data HDR1 and the second conversion information CHDR2 longer than to output only the first read data HDR1.

If the memory device 100 generates and outputs XOR operation information (that is, HDR1+HDR2) of the first read data HDR1 and the second read data HDR2, because the XOR operator needs to be formed inside the memory device 100, the miniaturization/integration of the memory device 100 is hindered. In addition, if the first/second read data HDR1 and HDR2 are N bits, the XOR operation information is also N bits. Therefore, it takes twice as much time to output both the first read data HDR1 and the XOR operation information, than to output only the first read data HDR1.

In the storage device according to some embodiments, the memory device 100 outputs only the first read data HDR1 and the second conversion information CHDR2, and to do this, only the first linear operator 190 (for example, a compressor) may be formed in the memory device 100. For example, although the first linear operator 190 may be installed in the page buffer and the sensing amplifier block (see 120 of FIG. 2), embodiments are not limited thereto. Therefore, miniaturization/integration of the memory device 100 is not hindered. Further, because compressed data (that is, second conversion information CHDR2) is output, the data transmission time does not increase significantly.

In addition, the reliability information WRB is generated by the memory controller 200 rather than the memory device 100. That is, the memory controller 200 includes an operator 292 (for example, XOR operation) and the inverse linear operator 294, and generates the reliability information WRB. Because the memory controller 200 has more space than the memory device 100, such additional modules may be installed.

The linear operators 190 and 290 perform the linear operation so that the reliability information WRB may be generated in the memory controller 200. This is because F(HDR1)+F(HDR2), which is a value obtained by XOR operation of CHDR2(=F(HDR2)) generated by the memory device 100, and CHDR1(=F(HDR1)), generated by the memory controller 200, becomes the same as F(HDR1+HDR2). This is because F(A)+F(B)=F(A+B) is established only for the linear operation function F. If F is not a linear operation function, $F^{-1}$(CHDR1+CHDR2) only becomes $F^{-1}$(F(HDR1)+F(HDR2)). Because F is a linear operation function, $F^{-1}$(CHDR1+CHDR2)=$F^{-1}$(F(HDR1)+F(HDR2))=$F^{-1}$(F(HDR1+HDR2))=HDR1+HDR2 may be obtained.

The effects of the storage device according to some embodiments are summarized as illustrated in [Table 1] below. In the case of the hard decision decoding, although the number of read times is one and the data output time is short, the error correction capability is not good. In the case of the soft decision decoding, although the error correction capability is good, the number of read times is at least three times, and the data output time is at least twice that of the hard decision decoding. As described above, the storage device according to some embodiments has good error correction capability, and the number of read times and the data output time are shorter than those of the soft decision decoding.

TABLE 1

|  | Hard decision decoding | Soft decision decoding | Present Disclosure |
| --- | --- | --- | --- |
| Number of read times | One | At least three | Two |
| Data output time | 1 time (reference) | At least twice compared to hard decision decoding | Maximum 1.1 times compared to hard decision decoding |
| Error correction capability | Bad | Good | Good |

Hereinafter, an embodiment relating to BCH decoding will be described with reference to FIGS. 7 to 10. That is, a syndrome former is used as an example of the first and second linear operators 190 and 290.

Figure 7:
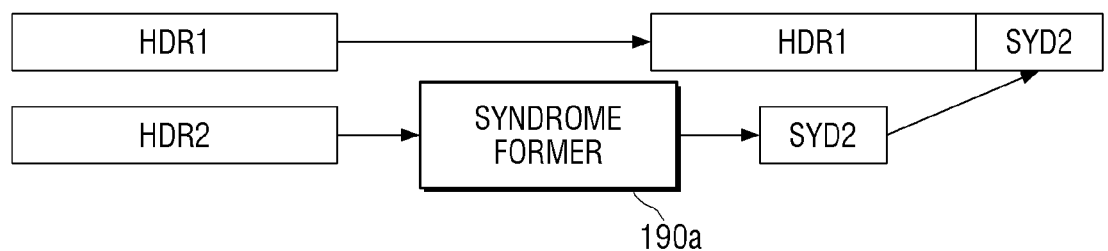
FIG. 7 is another block diagram for explaining the action of the memory device in the storage device according to another embodiment.
Figure 8:
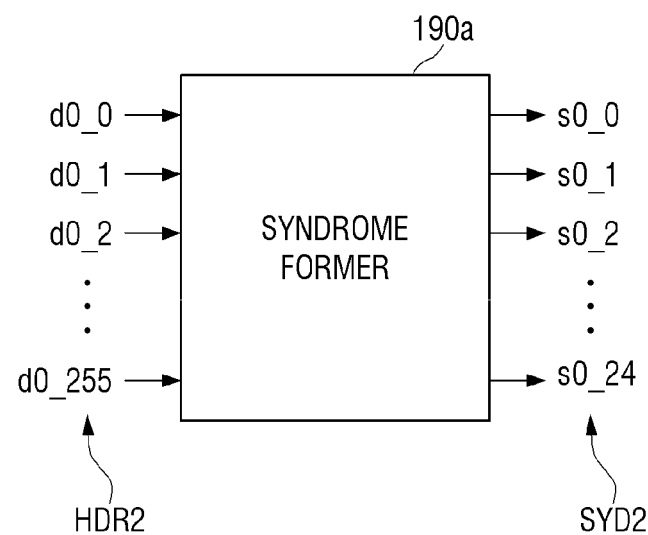
FIG. 8 is a diagram for explaining an example of a syndrome former.
Figures 9, 10:
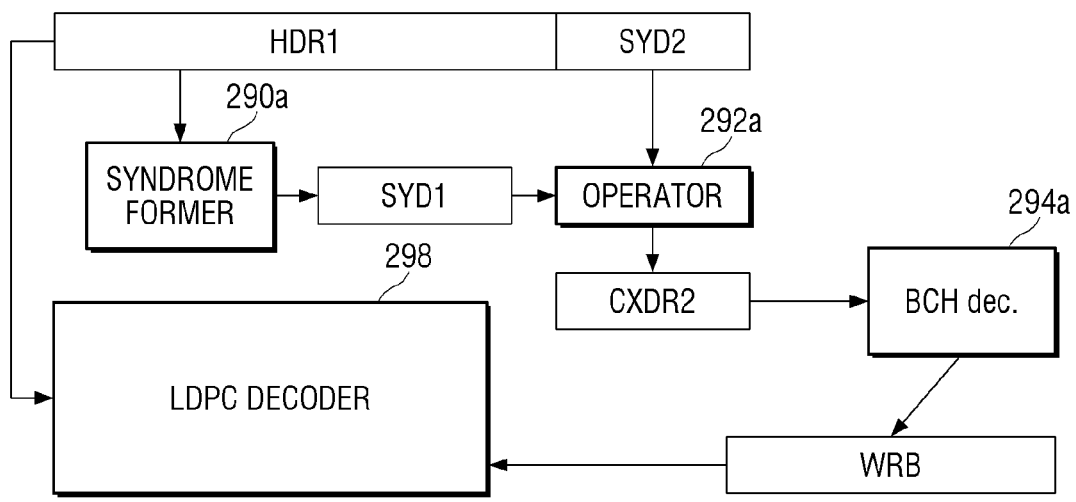
FIG. 9 is another block diagram for explaining the action of the memory controller in the storage device according to another embodiment.
FIG. 10 is a diagram for explaining a relationship between new syndrome and reliability information.

FIG. 7 is another block diagram for explaining the action of the memory device in the storage device according to another embodiment. FIG. 8 is a diagram for explaining an example of a syndrome former 190a. FIG. 9 is another block diagram for explaining the action of the memory controller in the storage device according to another embodiment. FIG. 10 is a diagram for explaining a relationship between new syndrome and reliability information. For the sake of convenience of explanation, differences from those described with reference to FIGS. 5 and 6 will be mainly described.

The BCH decoding used in FIGS. 7 to 10 may correct 100% of errors below a specific number depending on the number of parity bits. Specifically, when the size of data (i.e., a field size) is $2^m-1$ bits, if the number of parity bits is equal to or greater than m×t (here, m and t are natural numbers), the maximum number of errors that can be corrected by 100% is t. That is, the values of parameters m and t indicate whether the error correction of BCH decoding is possible. The BCH extended decoding is an extension of BCH decoding. When the data size is $2^m$, if the number of parity bits is equal to or greater than m×t+1, the maximum number of errors that can be corrected by 100% is t. In the case of BCH extended decoding, in the data of 256(=$2^8$) bits, if the parity bit is 25(=8×3+1) bits, three errors can be completely corrected. Hereinafter, the BCH decoding also includes BCH extended decoding.

The BCH decoding consists of three steps of a syndrome operation, an execution of Berlekamp Massey (BM) algorithm and an execution of Chien Search.

Referring to FIG. 7, the memory device 100 includes syndrome former 190a. The memory device 100 reads the same memory cells twice to generate read data HDR1 and HDR2. The first read data HDR1 and the second read data HDR2 may be hard decision read data obtained by the hard decision read operation.

The second read data HDR2 is converted into the second syndrome SYD2 through the first syndrome former 190a. Subsequently, the memory device 100 outputs the first read data HDR1 and the second syndrome SYD2 to the memory controller 200. If the first syndrome former 190a is expressed by the function S, SYD2=S(HDR2) is obtained, and the memory device 100 generates/outputs HDR1+SYD2 (=HDR1+S(HDR2)).

The first syndrome former 190a multiplies the second read data HDR2 by a parity check matrix to generate a second syndrome SYD2. As described above, the second read data HDR2 is a code word and includes n-bit data and w-bit parity bits. If the second read data HDR2 is multiplied by the parity check matrix, a w-bit second syndrome SYD2 is generated. That is, the size of the second syndrome SYD2 may be the same as the size of the parity bit, but is not limited thereto.

The first syndrome former 190a corresponds to a linear operator (see 190 of FIG. 5), and may be configured only by the linear operation XOR or XNOR.

Referring to FIG. 8, the first syndrome former 190a may be configured only by an XOR operation. The first syndrome former 190a converts the second read data HDR2 of 256 (=$2^8$) bits into the second syndrome SYD2 of 25(=8×3+1) bits. For example, as illustrated in [Table 2], the first syndrome former 190a may be expressed by an XOR operation of some of the input values.

TABLE 2

| Output value | Relationship with input values (XOR operation) |
|---|---|
| s0_0 | d0_0 + d0_230 + d0_232 + d0_234 . . . d0_255 |
| s0_1 | d0_1 + d0_230 + d0_233 . . . + d0_254 + |
| . . . | . . . |
| s0_24 | d0_24 + d0_231 + d0_233 + d0_252 |

Referring to FIG. 9, the memory controller 200 includes syndrome former 290a, operator 292a, BCH decoder 294 and decoder 298 (e.g., LDPC decoder). The memory controller 200 receives provision of the first read data HDR1 and the second syndrome SYD2 from the memory device 100.

Next, the first read data HDR1 is converted using the second syndrome former 290a to generate the first syndrome SYD1. The linear operator (see 190a of FIG. 7) for generating the second syndrome SYD2 and the second syndrome former 290a for generating the first syndrome SYD1 are of the same type. If the second syndrome former 290a is expressed by the function S, SYD1=S(HDR1) is established.

Subsequently, the operator 292a performs a logical operation (for example, an XOR operation or an XNOR operation) on the first syndrome SYD1 and the second syndrome SYD2 to generate a new syndrome CXDR2. That is, CXDR2=SYD1+SYD2=S(HDR1)+S(HDR2). Further, because the syndrome formers 190a and 290a perform the linear operation, S(HDR1)+S(HDR2)=S(HDR1+HDR2) is established. In the above example, because the first and second syndromes SYD1 and SYD2 are 25 bits and the logical operation is a logical XOR operation, CXDR2 is also 25 bits.

Subsequently, the inverse operator 294a executes a BM algorithm and a Chien Search, converts the new syndrome CXDR2, and generates reliability information WRB. The BM algorithm and Chien Search correspond to the inverse operation of the syndrome unit in the BCH decoding. That is, the action of BM algorithm and Chien Search may be summarized as WRB=$S^{-1}$(CXDR2)=$S^{-1}$(SYD1+SYD2)=$S^{-1}$(S(HDR1+HDR2))=HDR1+HDR2. As a result, the reliability information WRB is HDR1+HDR2. The reliability information WRB is 256 bits having the same size as those of the first read data HDR1 and the second read data HDR2.

The decoder 298 executes an action of correcting an error of the first read data HDR1 on the basis of the first read data HDR1 and reliability information WRB.

An example related to the contents described with reference to FIGS. 7 to 9 will be described below. The following is an example of BCH decoding in the case of parameters m=3 and t=1.

Assume that the first read data HDR1 and the second read data HDR2 are code words of 7-bits (=$2^3$–1) size. In the 7-bit code words, 4 bits are data, and 3 bits (=3×1) are parity bits. That is, the first read data HDR1 and the second read data HDR2 are 1×7 vectors.

Each of the first and second syndrome formers 190a and 290a is a 7×3 matrix.

The first syndrome SYD1 is obtained by multiplying the first read data HDR1 by the first syndrome former 190a. The second syndrome SYD2 is obtained by multiplying the second read data HDR2 by the second syndrome former 290a. Therefore, the first syndrome SYD1 and the second syndrome SYD2 are 1×3 vectors.

Because the new syndrome CXDR2 is an operation result of the first syndrome SYD1 and the second syndrome SYD2, it is a 1×3 vector.

When the BM algorithm and Chien Search are executed for the new syndrome CXDR2, the reliability information WRB of 1×7 vector is generated again.

As mentioned above, in the case of m=3 and t=1, that is, if the data size is 7 (=$2^3$–1) bits and the number of parity bits is 3 (=3×1) bits, when there is one error in the data, the error may be corrected by 100%. This is because, as summarized in FIG. 10, the new syndrome CXDR2 and the reliability information WRB are matched one to one.

For example, when the new syndrome CXDR2 is 000, the reliability information WRB is 0000000, which means that the first read data HDR1 and the second read data HDR2 are completely the same. That is, there is no error bit in the first read data HDR1.

When the new syndrome CXDR2 is 001, the reliability information WRB is 0000001, which means that the last bit of the first read data HDR1 is different from the last bit of the second read data HDR2. Therefore, the decoder 298 may correct the last bit of the first read data HDR1.

Similarly, when the new syndrome CXDR2 is 111, the reliability information WRB is 1000000, which means that the first bit of the first read data HDR1 is different from the first bit of the second read data HDR2. Therefore, the decoder 298 may correct the first bit of the first read data HDR1.

If the 7-bit first read data HDR1 has an error of two or more bits, error correction is not possible. The parameters (m or t) need to be converted to correct the error.

Specifically, the memory controller 200 may check whether the error correction of the first read data HDR1 is possible on the basis of the new syndrome CXDR2.

If the memory controller 200 determines that the error correction is not possible, the generated reliable information WRB is ignored and the first read data HDR1 may be processed in accordance with the preset manner. The preset manner is a manner that, for example, does not correct the first read data HDR1 on the assumption that there is no error in the first read data HDR1. Alternatively, the preset manner is a manner that corrects the first read data HDR1 on the assumption that an error has occurred in all the bits of the first read data HDR1.

Alternatively, if the memory controller 200 determines that the error correction is not possible more than a preset reference number of times, the parameters (m or t) may be converted. That is, the parameters (m or t) may be converted in the direction of increasing the number of bits of the first syndrome SYD1 and the second syndrome SYD2. As described above, because the number of bits of the first syndrome SYD1 and the second syndrome SYD2 is the same as the parity bit, it may be expressed by m×t. Therefore, by changing the parameters (m or t), the number of bits of the first syndrome SYD1 and the second syndrome SYD2 may be increased.

Figure 11:
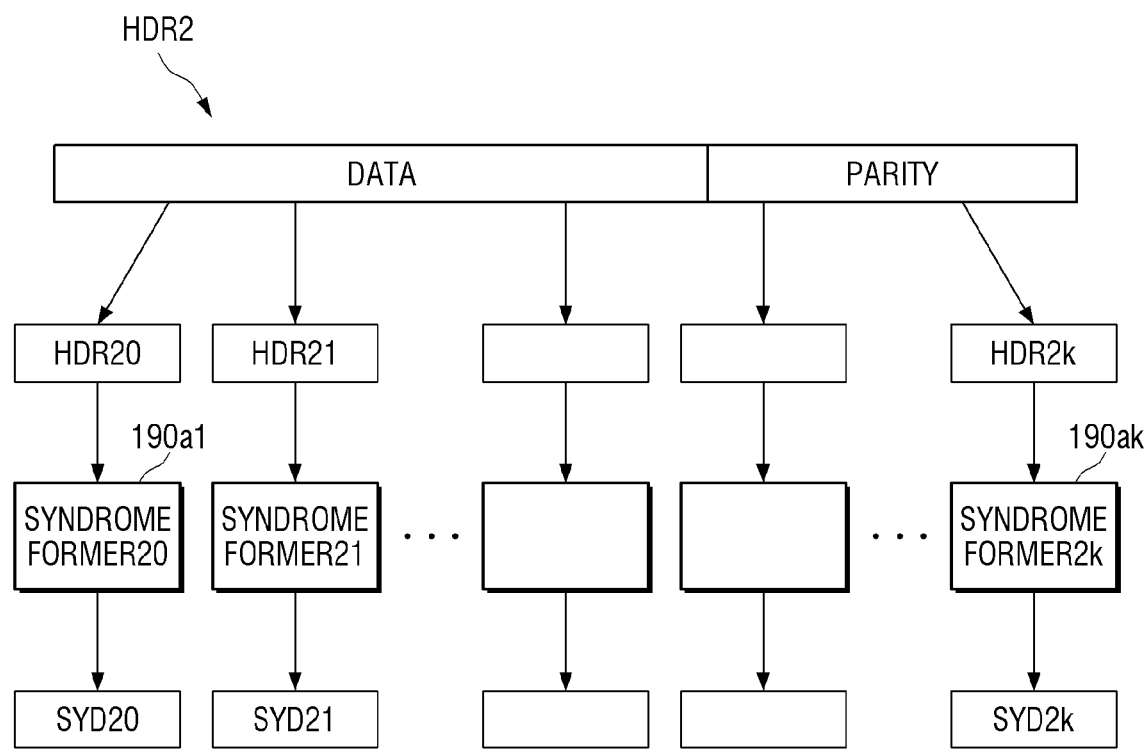
FIG. 11 is another block diagram for explaining the action of the memory device in the storage device according to another embodiment.
Figure 12:
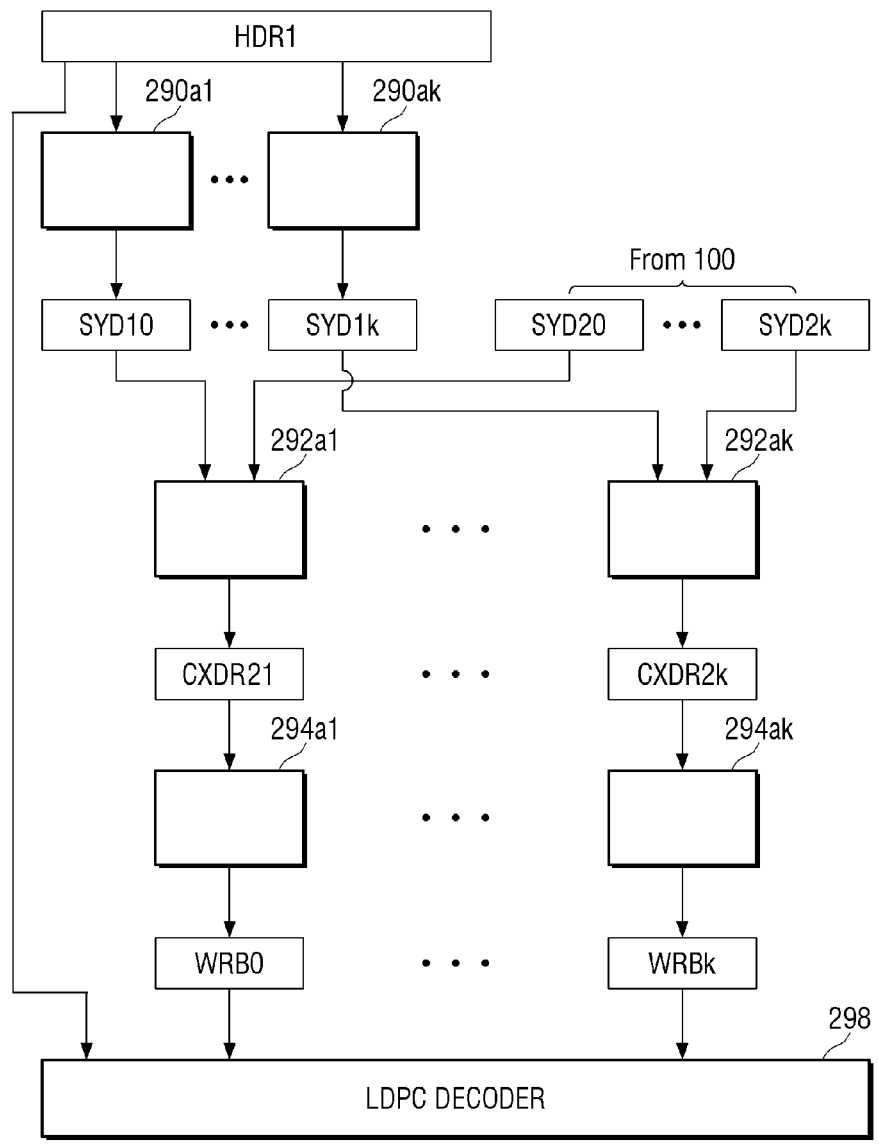
FIG. 12 is another block diagram for explaining the action of the memory controller in the storage device according to another embodiment.

FIG. 11 is another block diagram for explaining the action of the memory device in the storage device according to another embodiment. FIG. 12 is another block diagram for explaining the action of the memory controller in the storage device according to another embodiment. For the convenience of explanation, differences from those explained using FIGS. 5 to 10 will be mainly explained.

First/second read data HDR1 and HDR2 to be compressed (converted) do not need to match the format used in the ECC circuit (see 210 of FIG. 1) of the storage device. That is, the ECC circuit 210 of the storage device based on the NAND flash memory receives an input of very long (that is, a very large size) data and corrects the error. Therefore, no matter how simple a linear operator (or a syndrome former), it may be difficult to be implemented in the memory device 100 (i.e., page buffer and sensing amplifier (see 120 of FIG. 2)).

Referring to FIG. 11, the same memory cells are read to generate first read data HDR1 and second read data HDR2. Here, the memory cell may be, but is not limited to, a NAND flash memory cell. As shown, the memory device 100 may include a plurality of first syndrome formers 190a1 to 190ak.

The second read data HDR2 is divided into a plurality of second sub-read data HDR20 to HDR2k. For example, each of the second sub-read data HDR20 to HDR2k may be 256 bits.

Each of a plurality of second sub-read data HDR20 to HDR2k may be converted/generated into a plurality of second sub-syndromes SYD20 to SYD2k, using the plurality of first syndrome formers 190a1 to 190ak. For example, each of the second sub-syndromes SYD20 to SYD2k may be 25 bits. As described above, the size of each second sub-syndrome SYD20 to SYD2k may be about 10% of the size of the corresponding second sub-read data HDR20 to HDR2k. In the case of BCH decoding, the number of errors that may be corrected is determined depending on parameter values (i.e., values of m and t). For example, in the case of BCH extended decoding, if there are 25 parity bits (=8×3+1) in the data of 256 (=$2^8$) bits, three errors may be completely corrected. In general, occurrence probability of error in the NAND flash memory device is in the level of 0.1% to 1%. In the case of data of 256 bits, about three or less errors may occur. Therefore, if there are 25 parity bits in the data of 256 bits, most of the errors may be corrected.

The memory device 100 outputs the first read data HDR1 and a plurality of second sub-syndromes SYD20 to SYD2k to the memory controller 200.

Referring to FIG. 12, the memory controller 200 may receive provision of the first read data HDR1 and a plurality of second sub-syndromes SYD20 to SYD2k.

Subsequently, the first read data HDR1 is divided into a plurality of first sub-read data HDR10 to HDR1k.

Subsequently, each of a plurality of first sub-read data HDR10 to HDR1k is converted using a plurality of second syndrome formers 290a1 to 290ak to generate a plurality of first sub-syndromes SYD10 to SYD1k.

Subsequently, a plurality of mutually corresponding first sub-syndromes SYD10 to SYD1k and second sub-syndromes SYD20 to SYD2k is subjected to a logical operation (for example, an XOR operation) using a plurality of operators 292a1 to 292ak to generate a plurality of sub-new syndromes CXDR21 to CXDR2k.

Subsequently, each of a plurality of sub-new syndromes CXDR21 to CXDR2k is converted by a plurality of inverse operators 294a1 to 294ak to generate a plurality of sub-reliability information WRB0 to WRBk. Each of the plurality of sub-reliability information WRB0 to WRBk may be an XOR operation result of the first sub-read data HDR10 to HDR1k and the second sub-read data HDR20 to HDR2k corresponding to each other.

Subsequently, the decoder 298 may correct the error of the first read data HDR1 on the basis of the plurality of first sub-read data HDR10 to HDR1k and a plurality of sub-reliability information WRB0 to WRBk.

As described with reference to FIGS. 11 and 12, the memory controller 200 executes the division of the first read data HDR1 into a plurality of first sub-read data HDR10 to HDR1k. However, embodiments are not limited thereto. That is, the memory device 100 divides the first read data HDR1 into a plurality of first sub-read data HDR10 to HDR1k, and a plurality of second sub-syndromes SYD20 to SYD2k corresponding to the plurality of first sub-read data HDR10 to HDR1k may also be output together.

Further, although FIGS. 11 and 12 explain the first syndrome formers 190a1 to 190ak, the first sub-syndromes SYD10 to SYD1k, the second syndrome formers 290a1 to 290ak, the second sub-syndromes SYD20 to SYD2k, the sub-new syndromes CXDR21 to CXDR2k and the like, these may be explained by changing to a first linear operator, a first sub-conversion information, a second linear operator, a second sub-conversion information, a sub-operation information, and the like, respectively.

Figure 13:
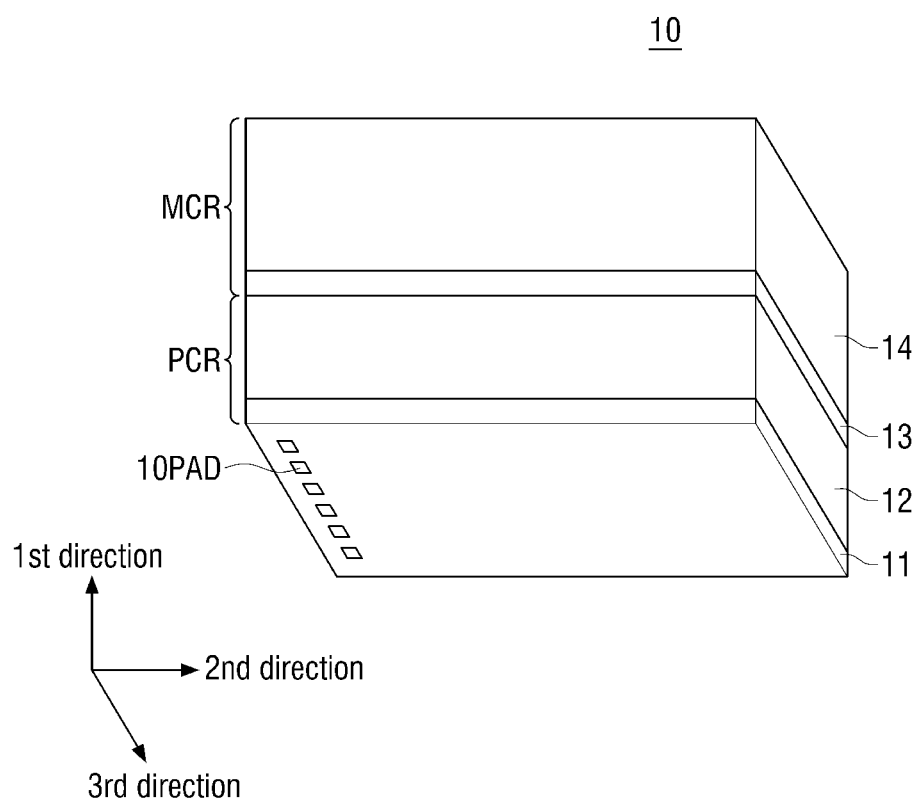
FIG. 13 is a perspective view for explaining a memory device used in a storage device according to some embodiments.

FIG. 13 is a perspective view for explaining a memory device 100 used in the storage device according to some embodiments.

Referring to FIG. 13, a direction substantially perpendicular to an upper face of a substrate 11 is defined as a first direction, and two directions intersecting each other while being parallel to the upper face of the substrate are defined as a second direction and a third direction, respectively. For example, the second direction and the third direction may substantially perpendicularly intersect each other.

The memory device 100 includes a peripheral circuit region PCR in which peripheral circuits are formed, a memory cell region MCR in which a memory cell array is formed, and I/O pads PAD.

The peripheral circuit region PCR may include a semiconductor substrate 11, a peripheral circuit formed on the upper face of the semiconductor substrate 11, and a lower insulating film 12 which covers the peripheral circuit. The memory cell region MCR may include a base layer 13 formed on the upper face of the lower insulating film 12, a memory cell array formed on the upper face of the base layer 13, and an upper insulating film 14 which covers the memory cell array. The I/O pads PAD are formed on the lower face 11 of the semiconductor substrate. The I/O pads PAD may be formed to overlap a part of the memory cell array, that is, a part of the memory cell region MCR in a vertical direction. As will be described later, the I/O pads PAD may be formed to cover through-silicon vias formed in the peripheral circuit region PCR.

The memory device 100 adopts a Cell on Peri (COP) structure in which a peripheral circuit is formed on the semiconductor substrate 11 and a memory cell array is stacked on the peripheral circuit. Thus, the size of the memory device 100 can be reduced.

In some embodiments, a linear operator (see 190 of FIG. 5), a syndrome former (190*a* of FIG. 7, and 190*a*1 to 190*ak* of FIG. 11) and the like need to be additionally formed in the memory device 100. If the memory device 10 adopts the COP structure, because the peripheral circuit region PCR increases by the memory cell region MCR, there are enough spaces to form the linear operator and the syndrome former described above.

At least one of the controllers, circuits, generators, decoders, buffers, control logics, operators, syndrome formers, blocks, components, elements, modules or units represented by a block as illustrated in FIGS. 1, 2, 5-9, 11 and 12 may be embodied as various numbers of hardware, software and/or firmware structures that execute respective functions described above, according to an exemplary embodiment. For example, at least one of these circuits, generators, decoders, buffers, control logics, operators, syndrome formers, blocks, components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

In concluding the detailed description, those skilled in the art will appreciate that many variations and modifications may be made to the embodiments without substantially departing from the principles.

What is claimed is:

1. An operating method of a storage device including a memory device and a memory controller, comprising:
receiving, by the memory controller, from the memory device, a first read data and a second conversion information, the second conversion information comprising data obtained by the memory device converting a second read data based on a linear operation, and the first read data and the second read data comprising data read from same memory cells of the memory device;
converting, by the memory controller, the first read data based on the linear operation to generate a first conversion information;
performing, by the memory controller, a logical operation on the first conversion information and the second conversion information to generate an operation information;
performing, by the memory controller, an inverse operation of the linear operation on the operation information to generate a reliability information; and
correcting, by the memory controller, an error of the first read data based on the first read data and the reliability information.

2. The operating method of the storage device of claim 1, wherein the first read data comprises N bits and the first conversion information comprises M bits,
wherein the second read data comprises N bits and the second conversion information comprises M bits,
wherein N is a natural number of 2 or more, and
wherein M is a natural number smaller than N.

3. The operating method of the storage device of claim 2, wherein M is equal to or less than 10% of N.

4. The operating method of the storage device of claim 1, wherein the first read data and the second read data are hard decision read data.

5. The operating method of the storage device of claim 1, further comprising identifying, by the memory controller, whether to perform error correction of the first read data according to the reliability information based on the operation information,
wherein the correcting the error of the first read data comprises:
processing, by the memory controller, the first read data based on identifying not to perform the error correction according to the reliability information; and
processing, by the memory controller, the first read data based on the reliability information based on identifying to perform the error correction according to the reliability information.

6. The operating method of the storage device of claim 1, further comprising:
converting, by a first linear converter provided in the memory device, the second read data based on the linear operation to generate the second conversion information; and
converting, by a second linear converter provided in the memory controller, the first read data based on the linear operation to generate the first conversion information.

7. The operating method of the storage device of claim 1, wherein the linear operation comprises only XOR or only XNOR.

8. The operating method of the storage device of claim 1, wherein the linear operation is executed by a syndrome former.

9. The operating method of the storage device of claim 8, wherein the inverse operation comprises executing a Berlekamp Massey algorithm and executing a Chien Search.

10. The operating method of the storage device of claim 1, wherein the memory cells are NAND flash memory cells, and
the first read data comprises 256 bits and the first conversion information comprises 25 bits.

11. The operating method of the storage device of claim 1, wherein the logical operation comprises an XOR operation or an XNOR operation.

12. The operating method of the storage device of claim 1, wherein the first read data and the second read data are read from the same memory cells at same threshold voltage.

13. The operating method of the storage device of claim 1, wherein the first read data and the second read data are read from the same memory cells at different threshold voltages.

14. A storage device comprising:
a memory device configured to read a first read data and a second read data from same memory cells, convert the second read data based on a linear operation to generate a second conversion information, and output the first read data and the second conversion information; and
a memory controller configured to receive the first read data and the second conversion information, convert the first read data based on the linear operation to generate a first conversion information, execute a logical operation on the first conversion information and the second conversion information to generate an operation information, perform an inverse operation of the linear operation on the operation information to generate a reliability information, and correct an error of the first read data based on the first read data and the reliability information.

15. The storage device of claim 14, wherein the memory device has a Cell on Peri structure.

16. The storage device of claim 14, wherein the first read data comprises N bits and the first conversion information comprises M bits,
wherein the second read data comprises N bits and the second conversion information is M bits,
wherein N is a natural number of 2 or more, and
wherein M is a natural number smaller than N.

17. The storage device of claim 14, wherein the memory device comprises a first linear converter configured to convert the second read data based on the linear operation to generate the second conversion information, and
wherein the memory controller comprises a second linear converter configured to convert the first read data based on the linear operation to generate the first conversion information.

* * * * *